(12) United States Patent
Ohara et al.

(10) Patent No.: US 7,926,175 B2
(45) Date of Patent: Apr. 19, 2011

(54) WIRING BOARD, MULTILAYER WIRING BOARD, AND METHOD FOR MANUFACTURING THE SAME

(75) Inventors: Toshihiko Ohara, Sakura (JP); Yoshiharu Unami, Sakura (JP); Yuji Inatani, Sakura (JP); Shoji Ito, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/862,574

(22) Filed: Sep. 27, 2007

(65) Prior Publication Data

US 2008/0016685 A1  Jan. 24, 2008

Related U.S. Application Data

(62) Division of application No. 11/396,603, filed on Apr. 4, 2006, now abandoned.

(30) Foreign Application Priority Data

Apr. 7, 2005  (JP) ................................. 2005-110653

(51) Int. Cl.
*H05K 3/10* (2006.01)
(52) U.S. Cl. ........................................... 29/846; 29/825
(58) Field of Classification Search ................... 29/825, 29/846
See application file for complete search history.

(56) References Cited

U.S. PATENT DOCUMENTS

| | | | |
|---|---|---|---|
| 5,465,898 A | | 11/1995 | Schulz-Harder et al. |
| 5,588,207 A | * | 12/1996 | Kawakita et al. ............... 29/852 |
| 6,139,777 A | * | 10/2000 | Omoya et al. ................ 252/500 |
| 6,326,694 B1 | * | 12/2001 | Hatakeyama et al. ......... 257/774 |
| 6,518,514 B2 | * | 2/2003 | Suzuki et al. ................... 174/262 |
| 6,812,412 B2 | | 11/2004 | Obata et al. |
| 6,863,962 B2 | | 3/2005 | Nakatani et al. |
| 7,132,029 B2 | | 11/2006 | Nakatani et al. |
| 7,164,085 B2 | | 1/2007 | Saiki |
| 2001/0020549 A1 | | 9/2001 | Horiuchi et al. |

(Continued)

FOREIGN PATENT DOCUMENTS

DE  10042344 A1  3/2001

(Continued)

OTHER PUBLICATIONS

Kiyoshi Takagi, "Birudoappu Tasou Purinto Haiscnban Gijutsu (Build-up Multi-layer Printed Circuit Board Technology)", Nikkan Kogyo Shimbunsha, 2000, pp. 81-83 & 236-239, Japan.

*Primary Examiner* — Derris H Banks
*Assistant Examiner* — Azm Parvez
(74) *Attorney, Agent, or Firm* — Sughrue Mion, PLLC

(57) ABSTRACT

A method for manufacturing a wiring board comprising an insulating member, comprising: a penetrating hole formation process of forming a penetrating hole in the insulating member; a placement process of inserting a conductive connecting particle into the penetrating hole; a connecting particle pressing process of disposing the conductive layers on both surfaces of the insulating member, pressing the conductive layers toward the connecting particle in the penetrating hole, and deforming the connecting particle in the pressing direction to obtain the connecting member; and a patterning process of patterning the conductive layers, wherein, in the connecting particle pressing process, the pressing is performed such that the cross-sectional area in the direction along the insulating member surface of at least a portion of the connecting member is greater than the contact area of the connecting member with the conductive layers.

18 Claims, 11 Drawing Sheets

| U.S. PATENT DOCUMENTS | | | |
|---|---|---|---|
| 2002/0020557 A1* | 2/2002 | Nishii et al. | 174/262 |
| 2004/0050706 A1 | 3/2004 | Seita et al. | |
| 2004/0142161 A1 | 7/2004 | Kawakita et al. | |
| 2006/0249833 A1 | 11/2006 | Ohara et al. | |
| 2006/0289203 A1 | 12/2006 | Oda | |
| 2008/0016685 A1 | 1/2008 | Ohara et al. | |

| FOREIGN PATENT DOCUMENTS | | | |
|---|---|---|---|
| EP | 299136 A2 | | 1/1989 |
| EP | 627875 A1 | | 12/1994 |
| JP | 2001-156415 A | | 6/2001 |
| JP | 20040327510 A | | 11/2004 |
| JP | 2004342686 A | * | 12/2004 |

* cited by examiner

WIRING BOARD, MULTILAYER WIRING BOARD, AND METHOD FOR MANUFACTURING THE SAME

BACKGROUND OF THE INVENTION

1. Field of the Invention

The present invention relates to a wiring board in which conductive layers are formed on both surfaces of an insulating member, a multilayer wiring board in which an outer-layer wiring substrate is stacked onto at least one side of a wiring board, and a method for manufacturing these boards.

Priority is claimed from Japanese Patent Application No. 2005-110653, filed Apr. 7, 2005, the content of which is incorporated herein by reference.

2. Description of the Related Art

FIG. 27 shows an example of a conventional multilayer wiring board. In the multilayer wiring board shown in this figure, outer-layer wiring substrates 110 are formed on both sides of the wiring board 100A.

In the wiring board 100A, conductive layers 102 are formed on both sides of the insulating member 101 having a penetrating hole (through-hole) 103. Openings are formed in the conductive layers 102 at positions corresponding to the penetrating hole 103. The conductive layers 102 are connected together by a conductive layer 105 formed on the surfaces of the conductive layers 102 and on the inner surface of the penetrating hole 103.

The outer-layer wiring substrates 110 comprise an insulating layer 107 in contact on one side with the conductive layer 105, and a conductive layer 106 formed on the other side of the insulating layer 107.

As shown in FIG. 28 and FIG. 29, in order to manufacture this multilayer wiring board, after using laser machining, drilling or the like to form the penetrating hole 103 in the insulating member 101, a plating method is used to form the conductive layer 105 on the surfaces of the conductive layers 102 and on the inner surface of the penetrating hole 103, followed by formation of the insulating layers 107 and conductive layers 106.

FIG. 30 shows another example of a conventional multilayer wiring board. The multilayer wiring board shown in FIG. 30 has outer-layer wiring substrates 110 formed on both surfaces of a wiring board 100B.

The wiring board 100B has conductive layers 102a and 102b formed on the both surface of the insulating member 101 which has an opening 104 (via). An opening is formed in the conductive layer 102a at a position corresponding to the opening 104. A conductive layer 108 is formed on the surface of the conductive layer 102a and on the inner surface of the opening 104. The conductive layer 108 formed on the conductive layer 102b within the opening 104 and thus the conductive layers 102a and 102b are connected.

As shown in FIG. 31 and FIG. 32, to manufacture this multilayer wiring board, after using laser machining or the like to form the opening 104 in the insulating member 101, a plating method is used to form the conductive layer 108 on the surface of the conductive layer 102a and on the inner surface of the opening 104, and then the insulating layer 107 and conductive layer 106 are formed.

However, because the penetrating hole 103 and opening 104 remain opened in this multilayer wiring board, there is the possibility that a recess may be generated in the conductive layer 106 in the portion corresponding to this penetrating hole 103 and opening 104. If a recess is generated in the conductive layer 106, it becomes difficult to mount an electronic component or the like in this portion, and the component mounting density is reduced, which is a disadvantage from the standpoint of reducing size and thickness.

In the wiring board 100B, the conductive layer 108 formed by a plating method is also formed on the surface of the conductive layer 102a in addition to the inner surface of the opening 104. Consequently, in the wiring board 100B, the conductive layer is thick, and formation of fine wiring patterns is difficult.

FIG. 33 shows an example of a wiring board which may be used in a multilayer wiring board. In this wiring board 100C, the conductive layer 109 is formed on the surface of the conductive layer 102a and in the opening 104, and the conductive layers 102a and 102b are connected by the conductive layer 109. The conductive layer 109 is formed so as to fill the opening 104, and accordingly the surface is flat.

When forming the conductive layer 109 by a plating method, the layer may be formed by continuing the supply of metallic material until the opening 104 is completely filled.

Because the surface of the conductive layer 109 is flat in a multilayer wiring board which uses this wiring board 100C, there is the advantage that recesses are not generated in the conductive layer of the outer-layer wiring substrate formed on the top.

However, in such a multilayer wiring board, the conductive layer 109 must be formed so as to fill the opening 104, and thus an increase in the thickness for the conductive layer 109 is unavoidable. As a result, formation of a fine pattern in the conductive layer 109 is difficult. Further, the conductive layer 109 is thick and the overall thickness is increased, which are disadvantageous for the reduction in the size and the thickness of the electrical/electronic apparatus.

Techniques relating to a variety of the above multilayer wiring boards are described in Kiyoshi Takagi, Birudoappu Tasou Purinto Haisenban Gijutsu, Nikkan Kogyo Shimbun-sha.

SUMMARY OF THIS INVENTION

The present invention was conceived based on the above circumstances, and has as an aspect the provision of a wiring board, a multilayer wiring board using this wiring board, and a manufacturing method for these boards, which enables finer wiring patterns formed in conductive layers, while also raising the mounting density of components on the surfaces of conductive layers, by this means enabling greater thinness and compactness.

A method for manufacturing a wiring board according to a first exemplary, but nonlimiting, aspect of the invention is a method for manufacturing a wiring board having an insulating member having a penetrating hole; and conductive layers formed on both surfaces of the insulating member, and a conductive connecting member connecting the two conductive layers together is provided inside the penetrating hole; the method of manufacture includes a penetrating hole formation process of forming the penetrating hole in the insulating member, a placement process of inserting a conductive connecting particle into the penetrating hole, a connecting particle pressing process of placing the conductive layers on both surfaces of the insulating member, pressing the conductive layers toward the connecting particle in the penetrating hole, and deforming the connecting particle in the pressing direction to obtain the connecting member, and a patterning process of patterning the conductive layers; and, in the connecting particle pressing process, the pressing is performed such that the cross-sectional area in the direction along the insulating member surface of at least a portion of the connecting member is greater than the contact area of the connecting member with the conductive layers.

A method for manufacturing a wiring board according to a second exemplary, but nonlimiting, aspect of the invention is the above method of manufacture, in which, in the placement process, the dimension of the connecting particle in the insulating member thickness direction is larger than the thickness of the insulating member.

A method for manufacturing a wiring board according to a third exemplary, but nonlimiting, aspect of the invention is the above method of manufacture, in which, after the pressing process, the contact area of the connecting member with the conductive layers is greater than the contact area of the connecting particle with the conductive layers prior to the pressing process.

A method for manufacturing a wiring board according to a fourth exemplary, but nonlimiting, aspect of the invention is the above method of manufacture, in which, in the penetrating hole formation process, the penetrating hole is formed such that the inner diameter at one end is greater than the size of the connecting particle, and the inner diameter at the other end is smaller than the size of the connecting particle.

A method for manufacturing a multilayer wiring board according to a fifth exemplary, but nonlimiting, aspect of the invention is a method for manufacturing a multilayer wiring board in which one or more outer-layer wiring substrates is stacked onto a wiring board having an insulating member having a penetrating hole; and conductive layers formed on both surfaces of the insulating member, and a conductive connecting member connecting the conductive layers together is provided in the penetrating hole; the method of manufacture includes an outer-layer wiring substrate pressing process of placing an outer-layer wiring substrate on at least one surface of a wiring board obtained by one of the above manufacturing methods, and, by pressing the outer-layer wiring substrate toward the wiring board, connecting the outer-layer wiring substrate to the wiring board; and the pressing pressure in the outer-layer wiring substrate pressing process is made lower than the pressing pressure in the connecting particle pressing process.

A method for manufacturing a multilayer wiring board according to a sixth exemplary, but nonlimiting, aspect of the invention is the above method of manufacture, in which outer-layer wiring substrates are stacked onto both surfaces of the wiring board, and the number of outer-layer wiring substrates provided on one surface of the wiring board is equal to the number of outer-layer wiring substrates provided on the other surface.

A method for manufacturing a multilayer wiring board according to a seventh exemplary, but nonlimiting, aspect of the invention is the above method of manufacture, in which outer-layer wiring substrates are provided with an outer-layer side conductive layer of silver foil on one surface of the insulating layer having an opening, and the opening is filled with conductive paste so as to effect connection to the outer layer-side conductive layer.

A wiring board according to an eighth exemplary, but nonlimiting, aspect of the invention has conductive layers formed on both sides of an insulating member having a penetrating hole, with a conductive connecting member provided in the penetrating hole to connect the conductive layers together, and with at least a portion of the connecting member having cross-sectional area in the direction along the insulating member surface greater than the area of contact with the conductive layers.

A multilayer wiring board according to a ninth exemplary, but nonlimiting, aspect of the invention has an outer-layer wiring substrate stacked onto at least one surface of the above wiring board; the outer-layer wiring substrate is provided with an outer layer-side conductive layer of silver foil on one surface of an insulating layer having an opening, and the opening is filled with a conductive paste so as to be connected to the outer layer-side conductive layer.

In a method for manufacturing a wiring board in an exemplary, nonlimiting aspect, of the present invention, a connecting particle is deformed into a connecting member by pressing a conductive layer. At this time, pressing is performed such that the cross-sectional area of at least a portion of the connecting member is greater than the area of contact of the connecting member with a conductive layer.

By this, sufficient pressing pressure may be applied to the conductive layer, so that the surface may be made flat, and consequently the component mounting density on the conductive layer surface may be increased. Further, since the conductive layer may be formed thinner compared with cases in which a plating method is used to form a conductive layer in the opening, fine wiring patterns may be formed.

Consequently, the degree of flexibility in design may be increased, and an electrical/electronic apparatus employing this wiring board may be made thinner, more compact, and lighter in weight.

DETAILED DESCRIPTION OF THE INVENTION

Hereinafter, a first nonlimiting exemplary embodiment of a method for manufacturing a multilayer wiring board of the present invention is explained.

First, a method for manufacturing a wiring board 10 is explained.

Figure 1:
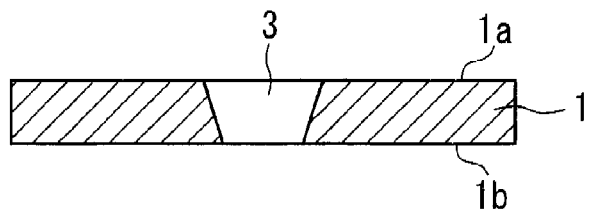
FIG. 1 is a cross-sectional view illustrating a manufacturing process of a first nonlimiting exemplary embodiment of a method for manufacturing a multilayer wiring board of the invention.

As shown in FIG. 1, an insulating member 1, in a plate shape and formed from an insulating material, is provided. The insulating member 1 may use, for example, at least one of a polyimide resin, an epoxy resin, an LCP (liquid crystal polymer) resin, a glass epoxy, an aramid fiber, and Teflon®. However, one of skill in the art would recognize that other suitable insulating materials may be used.

By means of laser machining, drilling or the like, a penetrating hole (through-hole) 3 is formed in the insulating member 1. A $CO_2$ laser, YAG laser, or the like may be used in laser machining.

The penetrating hole 3 may be formed with the inner diameter at one end (the inner diameter at one surface 1a of the insulating member 1) larger than the size of the connecting particle 4, and with the inner diameter at the other end (the inner diameter at the other surface 1b) smaller than the size of the connecting particle 4 so that the connecting particle 4 may be prevented from dropping out of the penetrating hole 3. In the example shown, the penetrating hole 3 is formed with a tapered shape, in which the inner diameter gradually becomes smaller from one end to the other end.

The process of forming a penetrating hole 3 in the insulating member 1 is referred to as the penetrating hole formation process.

Figure 2:
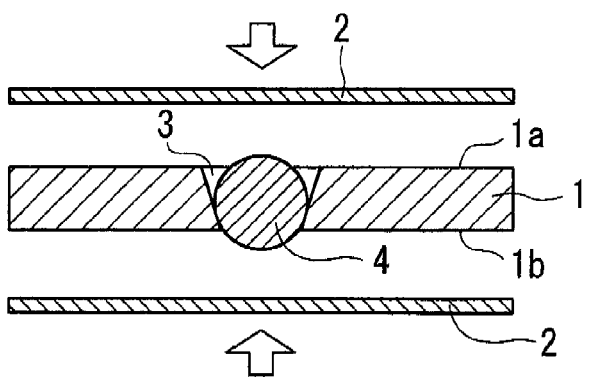
FIG. 2 is a cross-sectional view illustrating the manufacturing process subsequent to the previous drawing.

Next, the connecting particle 4 may be placed into the penetrating hole 3, as shown in FIG. 2.

As the connecting particle 4, a particle of a conductive metal, such as copper, aluminum, chromium, titanium, or another metal is used. In particular, a copper or a copper alloy may be used so that the conductivity with the inner layer-side conductive layer 2 is increased. For example, the connecting particle 4 be formed from high-purity copper; for example, copper of a purity of 99% or higher may be used.

There are no particular limitations on the shape of the connecting particle 4, and shapes such as, for example, a substantially spherical shape, a substantially ellipsoidal shape, a substantially columnar shape, a substantially polyhedral columnar shape, a substantially conic shape, and a substantially pyramidal shape, may be used. In particular, however, a shape may be used such that in the pressing process described below, the contact area with the inner layer-side conductive layer 2 is greater than that before pressing.

Of these shapes, a shape such that a point contact is established with the inner layer-side conductive layer 2, such as, for example, a substantially spherical shape, may be used. By adopting this shape, the amount of deformation in the pressing process when the connecting particle 4 becomes the connecting member 5 is large, and thus the electrical resistance between the inner layer-side conductive layers 2 and the connecting member 5 may be reduced and the bonding strength may be increased.

Also the dimension of the connecting particle 4 in the direction of thickness of the insulating member 1 may be greater than the thickness of the insulating member 1. In the example shown, the diameter of the connecting particle 4 is greater than the thickness of the insulating member 1, so that a portion of the connecting particle 4 protrudes from the surfaces of the insulating member 1.

As the connecting particle, a particle the dimension in the insulating member thickness direction of which is smaller than the thickness of the insulating member may also be used.

Hereinafter, the process of placing the connecting particle 4 into the penetrating hole 3 is referred to as the placement process.

Inner layer-side conductive layers 2, each made of metal foil, are disposed on the two surfaces of the insulating member 1. Copper, aluminum, chromium, titanium, or other metallic materials may be used for the inner layer-side conductive layers 2. Of these, a copper or a copper alloy may be effective.

The inner layer-side conductive layers 2 are pressed toward the connecting particle 4 in the penetrating hole 3. That is, the inner layer-side conductive layers 2 are pressed in the direction to bring them closer to each other (in the thickness direction of the insulating member 1).

At this time, a pressing pressure of 30 kgf/cm² or higher is appropriate. Here 1 kgf is equivalent to 9.80665 N. It is appropriate that the temperature during pressing be 200° C. or higher.

Figure 3:
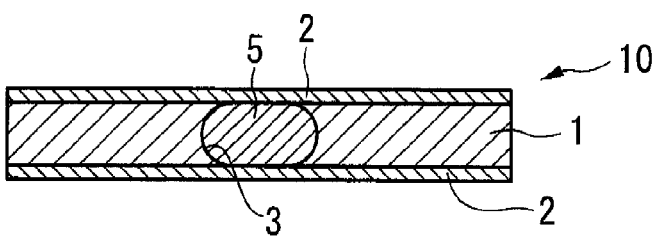
FIG. 3 is a cross-sectional view illustrating the manufacturing process subsequent to the previous drawing.

As shown in FIG. 3, the connecting particle 4 is deformed in the pressing direction, and becomes a connecting member 5 having a thickness substantially equal to the thickness of the insulating member 1, and in addition may be bonded with the inner layer-side conductive layers 2.

The connecting member 5 is directly bonded to the inner layer-side conductive layers 2. That is, the connecting member 5 and the inner layer-side conductive layers 2 are firmly bonded by metallic bonding or the like, substantially without requiring an additional member. Hence, the reliability of the connection between the connecting member 5 and the inner layer-side conductive layers 2 may be enhanced.

The connecting member 5 extends into the entire penetrating hole 3, and substantially assumes a shape which fills the penetrating hole 3.

It is believed that a firm bond is formed between the inner layer-side conductive layers 2 and the connecting member 5 because the oxide film that is present therebetween is broken, and in this portion the inner layer-side conductive layer 2 and the connecting member 5 may bond directly, without an intervening oxide film.

In this manufacturing method, pressing may be performed such that the cross-sectional area of at least a portion of the connecting member 5, in the direction along the surface of the insulating member 1 (the horizontal direction), is greater than the contact area between the connecting member 5 and the inner layer-side conductive layer 2.

In the nonlimiting exemplary embodiment shown in FIG. 3, the cross-sectional area along the horizontal direction of the connecting member 5, at the center in the thickness direction of the insulating member 1, is greater than the area of contact with the inner layer-side conductive layer 2.

By performing pressing such that the cross-sectional area of the connecting member 5 is greater than the area of contact with the inner layer-side conductive layer 2, sufficient pressing pressure may be applied to the inner layer-side conductive layer 2, so that the surface of the inner layer-side conductive layer 2 may be made flat. Hence, the component mounting density on the surface of the inner layer-side conductive layer 2 may be increased. Also, fine wiring patterns may be formed in the inner layer-side conductive layer 2.

Hereinafter, the process of deforming the connecting particle 4 into the connecting member 5 is referred to as the connecting particle pressing process.

The area of contact after pressing between the connecting member 5 and the inner layer-side conductive layer 2 is greater than the area of contact before pressing between the connecting particle 4 and the inner layer-side conductive layer 2. By thus performing pressing such that the contact area increases, the amount of deformation when the connecting particle 4 becomes the connecting member 5 may be increased sufficiently, and the electrical resistivity between the inner layer-side conductive layers 2 and the connecting member 5 may be reduced, while increasing the bonding strength.

Figure 4:
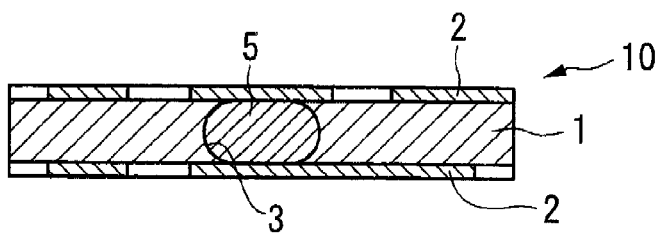
FIG. 4 is a cross-sectional view illustrating the manufacturing process subsequent to the previous drawing.

As shown in FIG. 4, the inner layer-side conductive layer 2 is patterned by etching or other techniques.

In patterning, for example, the subtractive method may be employed. More specifically, a resist layer is formed, and after forming the resist into a pattern according to the wiring pattern by photolithography techniques, the inner layer-side conductive layer 2 is etched.

Hereinafter, the process of patterning the inner layer-side conductive layer 2 is referred to as the patterning process.

After the above series of processes, a wiring board 10 is obtained in which inner layer-side conductive layers 2, formed on both surfaces of the insulating member 1, are connected together by the connecting member 5.

In the wiring board 10, the inner layer-side conductive layers 2 are connected by the connecting member 5 obtained by pressing and deforming the connecting particle 4; hence the electrical resistance between the inner layer-side conductive layers 2 and the connecting member 5 is reduced, and the conductivity between the inner layer-side conductive layers 2 may be increased.

Next, a method for manufacturing an outer-layer wiring substrate 13 is explained according to a nonlimiting exemplary embodiment.

Figure 5:
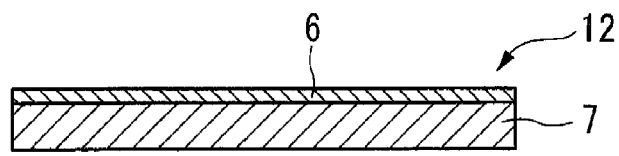
FIG. 5 is a cross-sectional view illustrating the manufacturing process subsequent to the previous drawing.

As is shown in FIG. 5, a metal-clad stacked substrate 12 (e.g., copper-clad stacked substrate), in which an outer layer-side conductive layer 6 is formed on one surface (the upper surface) of an insulating layer 7, is provided. Copper, aluminum, chromium, titanium, or other metallic materials is used in the outer layer-side conductive layer 6. In particular, a copper foil or other metal foils are appropriate. The same material as is used in the insulating member 1 may be used in the insulating layer 7.

Figure 6:
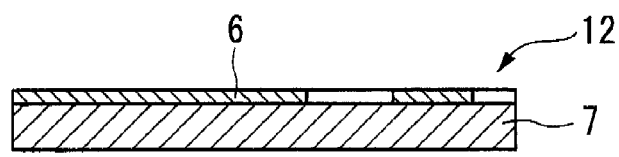
FIG. 6 is a cross-sectional view illustrating the manufacturing process subsequent to the previous drawing.

Next, a pattern of wiring is formed in the outer layer-side conductive layer 6 by etching or other techniques, as shown in FIG. 6.

Figure 7:
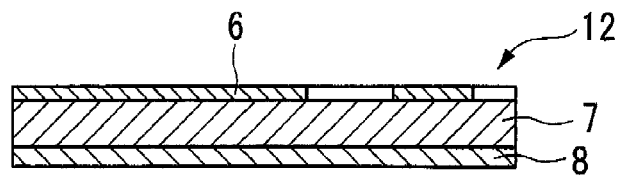
FIG. 7 is a cross-sectional view illustrating the manufacturing process subsequent to the previous drawing.

Next, an adhesive layer 8 is formed on the other surface (the lower surface) of the insulating layer 7, as shown in FIG. 7. As the adhesive used in the adhesive layer 8, epoxy resin, polyimide resin, acrylic resin, or the like may be used.

Figure 8:
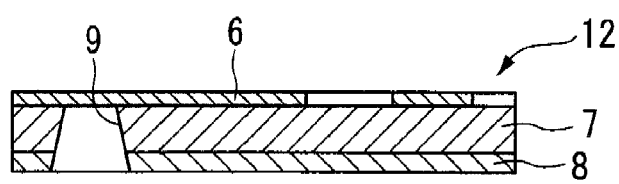
FIG. 8 is a cross-sectional view illustrating the manufacturing process subsequent to the previous drawing.

Next, as shown in FIG. 8, an opening (via) 9 is formed in the insulating layer 7 and adhesive layer 8 from the lower-surface side of the metal-clad stacked substrate 12. The opening 9 is formed so as to reach the outer layer-side conductive layer 6.

The opening 9 may be formed by laser machining, drilling, or other techniques. Also, a mold or die may be used in molding or stamping to fabricate an insulating layer 7 having the opening 9.

Figure 9:
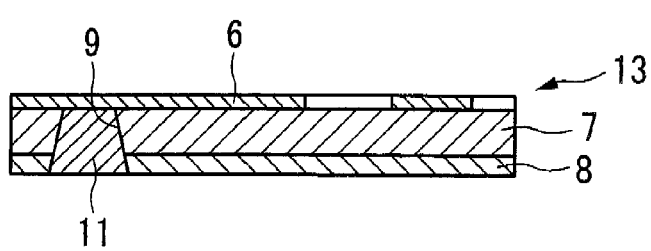
FIG. 9 is a cross-sectional view illustrating the manufacturing process subsequent to the previous drawing.

Next, as shown in FIG. 9, the opening 9 may be filled with a conductive paste to form a connecting portion 11 which is connected to the outer layer-side conductive layer 6.

As the conductive paste, a mixture of a conducting material and a binder resin may be used.

As the conducting material, at least one of silver, nickel, carbon, and copper may be used. The conducting material may be in particle form. As the binder, at lest one of an acrylic resin, vinyl acetate resin, epoxy resin, and polyester resin may be used. The amount of the binder used may be from 0.2 to 10 parts by weight to 100 parts by weight of the conducting material, and 0.5 to 5 parts by weight may be used.

The opening 9 may be filled with the conductive paste using a printing method or a dot injection method.

By this, an outer-layer wiring substrate 13 is obtained in which an outer layer-side conductive layer 6 is formed on one surface of the insulating layer 7, and a connecting portion 11 is provided in the opening 9.

Next, a method of manufacturing a multilayer wiring board using the wiring board 10 and outer-layer wiring substrates 13 is explained according to a nonlimiting exemplary embodiment.

Figure 10:
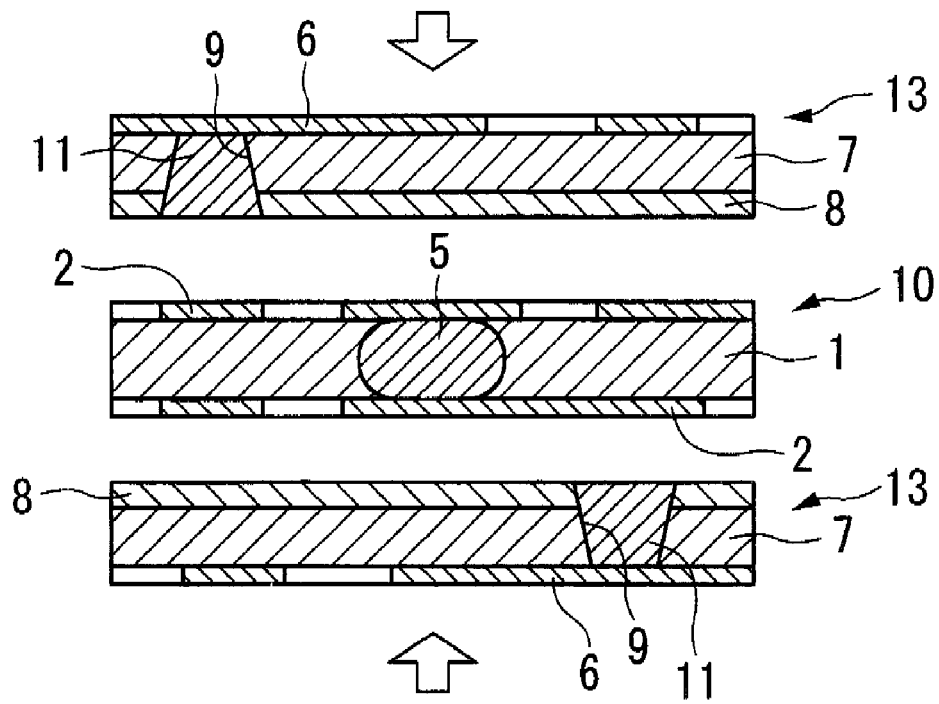
FIG. 10 is a cross-sectional view illustrating the manufacturing process subsequent to the previous drawing.
Figure 11:
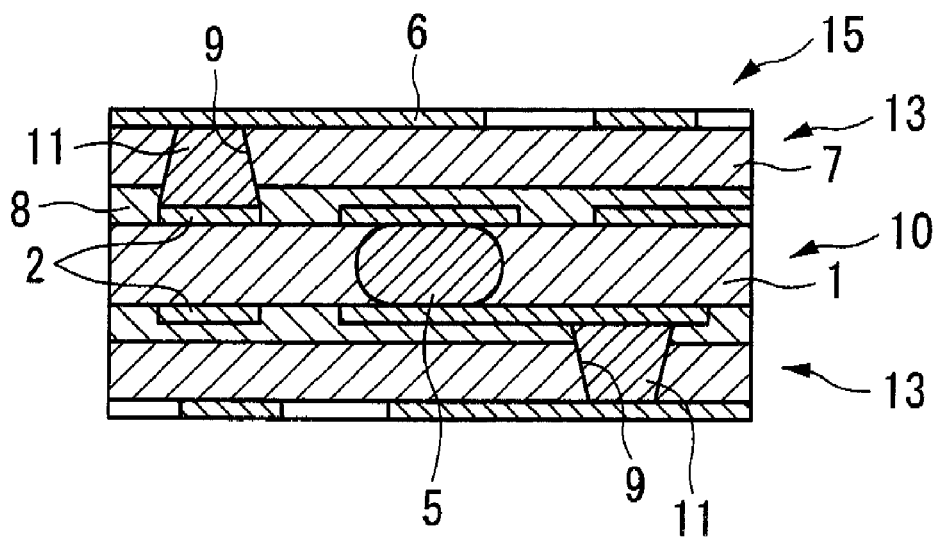
FIG. 11 is a cross-sectional view illustrating the manufacturing process subsequent to the previous drawing.

As shown in FIG. 10 and FIG. 11, outer-layer wiring substrates 13 may be stacked onto both surfaces of the wiring board 10, the outer-layer wiring substrates 13 may be pressed toward the wiring board 10, and the outer-layer wiring substrates 13 may be bonded to the wiring board 10 by the adhesive layer 8. The connecting portion 11 of the outer-layer wiring substrates 13 may be connected to the inner-layer side conductive layer 2 of the wiring board 10.

This process of pressing the outer-layer wiring substrates 13 toward the wiring board 10 is referred to as the outer-layer wiring substrate pressing process.

The pressing pressure in the outer-layer wiring substrate pressing process may be lower than the pressing pressure in the above-described connecting particle pressing process. The pressing pressure may be less than 30 kgf/cm².

By lowering the pressing pressure below the pressing pressure in the connecting particle pressing process, softening of the adhesive layer 8 may be prevented, and misalignment of the positions of the outer-layer wiring substrates 13, as well as the squeeze-out of adhesive, may be prevented. Further, deformation of the insulating member 1 may be prevented.

The temperature in the outer-layer wiring substrate pressing process is lower than the temperature in the connecting particle pressing process; for example, a temperature of under 200° C. is may be used and a temperature of under 180° C. may also be used. By setting the temperature in this range, softening of the adhesive layer 8 may be prevented, and misalignment of the positions of the outer-layer wiring substrates 13, as well as the squeeze-out of adhesive, can be prevented.

By this, a multilayer wiring board 15 is obtained in which a wiring board 10 and outer-layer wiring substrates 13 are stacked.

Figure 12:
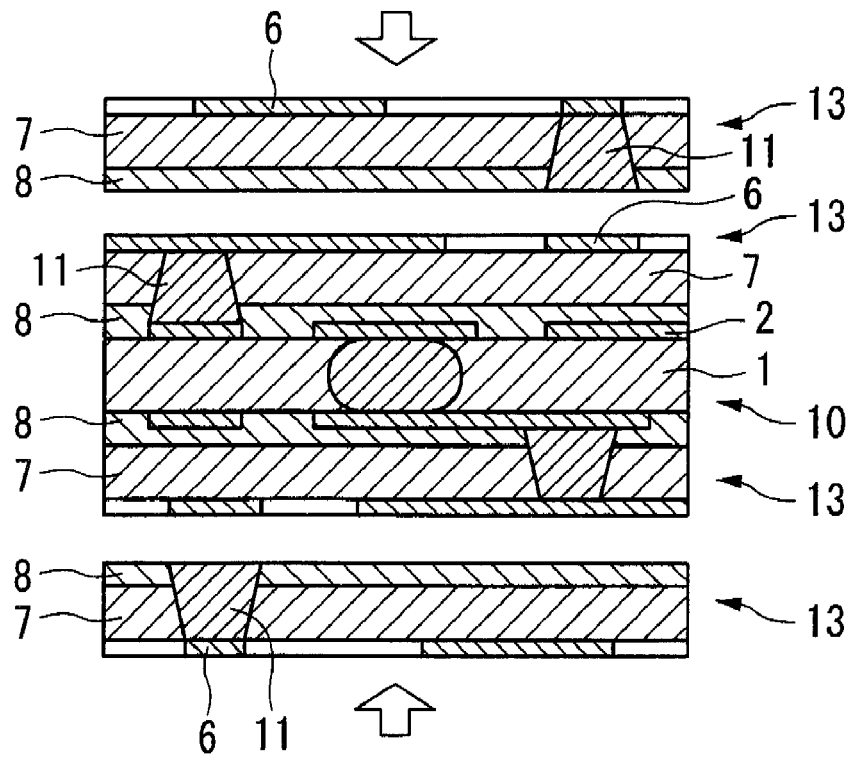
FIG. 12 is a cross-sectional view illustrating the manufacturing process subsequent to the previous drawing.
Figure 13:
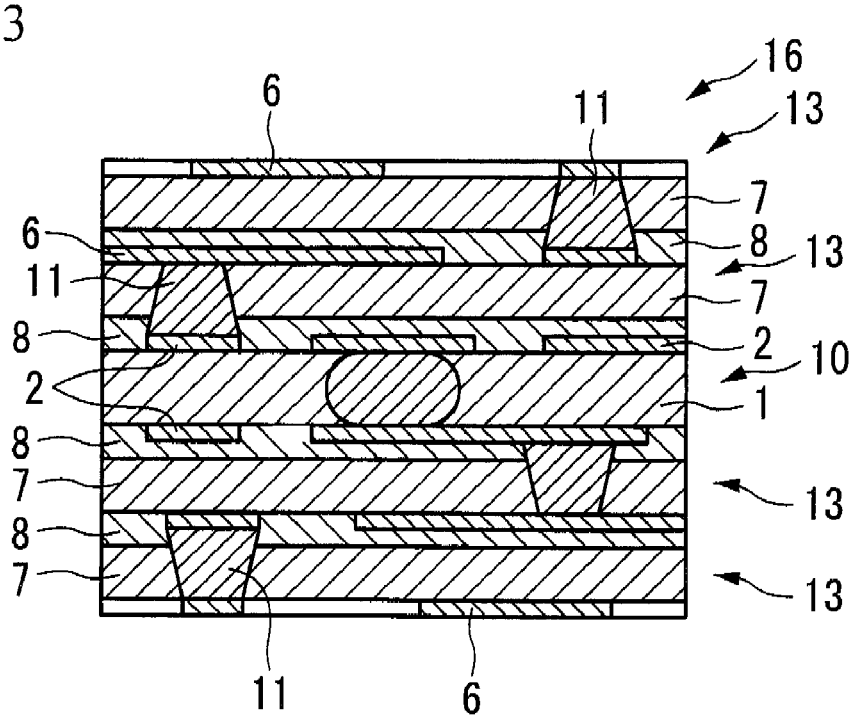
FIG. 13 is a cross-sectional view illustrating the manufacturing process subsequent to the previous drawing.

As shown in FIG. 12 and FIG. 13, a additional outer-layer wiring substrates 13 may be stacked onto the multilayer wiring board 15.

That is, by stacking outer-layer wiring substrates 13 onto both surfaces of the multilayer wiring board 15, and performing pressing in the thickness direction, the outer-layer wiring substrates 13 may be connected to the multilayer wiring board 15 by means of adhesive layers 8. The pressing pressure, the temperature and other conditions during pressing may be made the same as the conditions used when stacking outer-layer wiring substrates 13 onto the wiring board 10.

By this, a multilayer wiring board 16 is obtained in which two outer-layer wiring substrates 13 are stacked onto each of the surfaces of a wiring board 10.

In the multilayer wiring board 16, since a plurality of outer-layer wiring substrates 13 are formed on both surfaces of a wiring board 10, the wiring density may be increased.

In the multilayer wiring boards 15 and 16 shown in FIG. 11 and FIG. 13, since the number of outer-layer wiring substrates 13 provided on one surface of the wiring board 100 and the number of outer-layer wiring substrates 13 provided on the other surface are equal, the forces applied to both surfaces of the wiring board 10 during heating and the like are equal, and thus warping does not readily occur.

In a method for manufacturing the above multilayer wiring boards 15 and 16, since the connecting member 5 of the wiring board 10 fills the penetrating hole 3, there is no void left in the penetrating hole 3 and no recess is generated on the surface of the outer layer-side conductive layers 6. Consequently, it is possible to prevent problems during mounting of other components (integrated circuits and the like) on the multilayer wiring board 15 or 16.

Hence, the component mounting density may be raised, the degree of flexibility in design may be enhanced, and an electric/electronic apparatus may be made smaller, thinner, and more lightweight.

Figure 30:
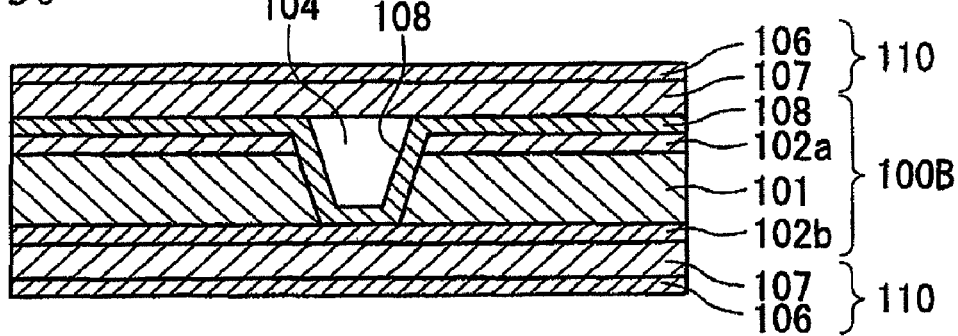
FIG. 30 is a schematic cross-sectional view illustrating another example of a conventional multilayer wiring board.
Figure 31:
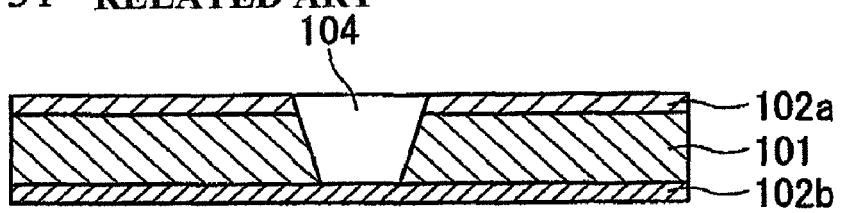
FIG. 31 is a cross-sectional view illustrating a manufacturing process of an example of a method for manufacturing the multilayer wiring board of the previous drawing.
Figure 32:
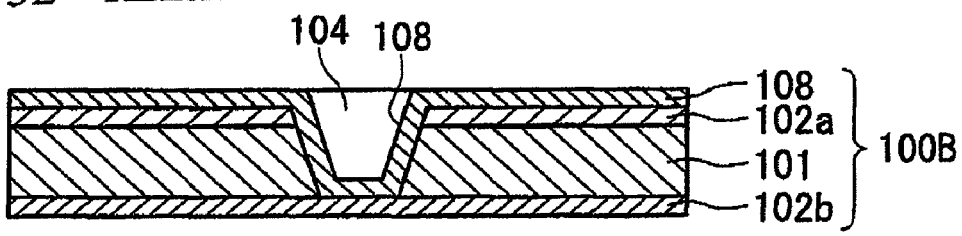
FIG. 32 is a cross-sectional view illustrating the manufacturing process subsequent to the previous drawing.
Figure 33:
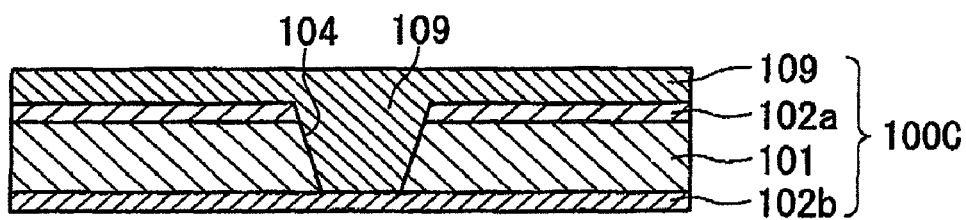
FIG. 33 is a schematic cross-sectional view illustrating a wiring board used in a further example of a conventional multilayer wiring board.

In the multilayer wiring boards 15 and 16, the inner layer-side conductive layers 2 may be formed thinner than in cases in which conductive layers are formed within openings by a plating method (shown in FIG. 30 and FIG. 33).

Therefore, a finer pattern may be formed in the inner layer-side conductive layers 2. Also, since the wiring board 10 may be formed thinner, the multilayer wiring boards 15 and 16 may be made thinner.

Hence an electrical/electronic apparatus may be made even smaller, thinner, and lighter in weight.

Further, because the inner layer-side conductive layers 2 may be made thinner, the flexibility in the wiring board 10 may be enhanced, for still greater freedom of design.

According to the above method of manufacture, since the outer layer-side conductive layers 6 and inner layer-side conductive layers 2 are connected by means of a connecting portion 11 formed from the conductive paste 11 in the outer-layer wiring substrates 13, the connecting portion 11 adheres closely to the inner layer-side conductive layers 2 without a void and the conductivity therebetween may be increased. Hence, the reliability of connection between the outer layer-side conductive layers 6 and the inner layer-side conductive layers 2 may be improved.

According to the above method of manufacture, a method is adopted in which, after bonding the outer-layer wiring substrates 13 to the wiring board 10 by stacking and pressing, additional outer-layer wiring substrates 13 are stacked and pressed; but manufacture is not limited to this method, and a method may be employed in which a plurality of outer-layer wiring substrates 13 are stacked onto the wiring board 10 and are all pressed at once. The pressing pressure, the temperature, and other conditions during pressing may be made the same as the conditions when stacking outer-layer wiring substrates 13 to the wiring board 10.

When this method is adopted, a plurality of outer-layer wiring substrates 13 may be bonded at once to the wiring board 10, the number of processes may be reduced, which is advantageous from the standpoint of manufacturing costs.

In the present invention, a configuration is also possible in which one or a plurality of outer-layer wiring substrates are stacked onto only one surface of a wiring board. Further, in the multilayer wiring board 16, although two outer-layer wiring substrates 13 are stacked onto each surface of the wiring board 10, the number of stacked outer-layer wiring substrates per surface of the wiring board may be three or greater.

Next, a second nonlimiting exemplary embodiment of a method for manufacturing a multilayer wiring board of the present invention is explained.

The manufacturing method of this embodiment differs from the manufacturing method of the first embodiment in that, after first stacking onto the wiring board 10 an outer-layer wiring substrate 13 on which a wiring pattern has not yet been formed, the wiring pattern is formed in the outer layer-side conductive layer 6. The following is a detailed explanation.

Figure 14:
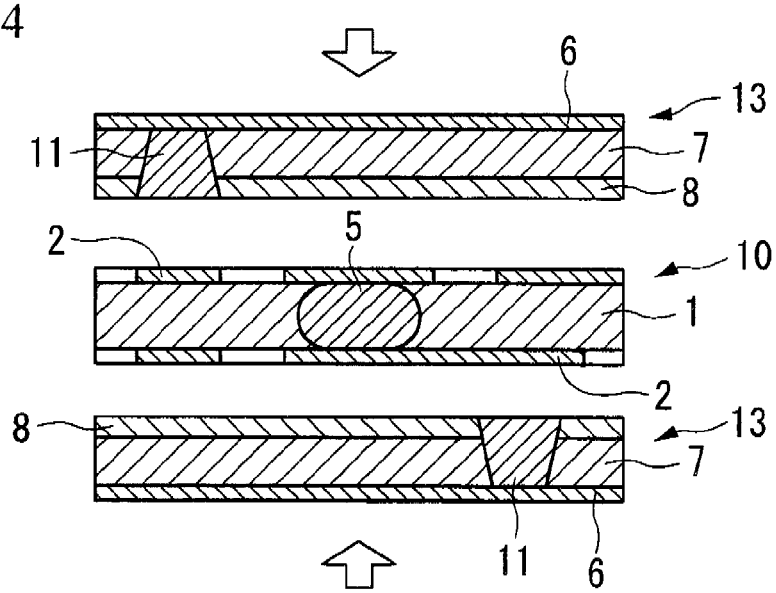
FIG. 14 is a cross-sectional view illustrating a manufacturing process of a second nonlimiting exemplary embodiment of a method for manufacturing a multilayer wiring board of the invention.
Figure 15:
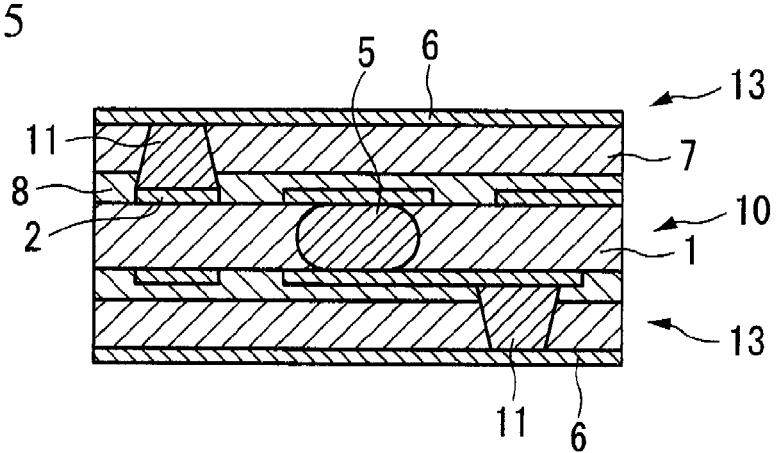
FIG. 15 is a cross-sectional view illustrating the manufacturing process subsequent to the previous drawing.

As shown in FIG. 14 and FIG. 15, outer-layer wiring substrates 13 in the outer layer-side conductive layers 6 of which a wiring pattern has not been formed are stacked onto both surfaces of a wiring board 10, and by performing pressing in the thickness direction, the outer-layer wiring substrates 13 and wiring board 10 are bonded together.

Figure 16:
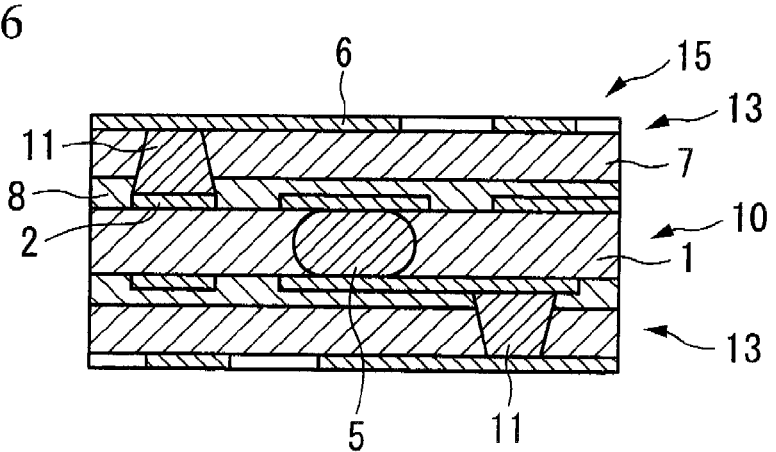
FIG. 16 is a cross-sectional view illustrating the manufacturing process subsequent to the previous drawing.

Next, as shown in FIG. 16, a pattern of wiring is formed in the outer layer-side conductive layers 6 of the outer-layer wiring substrates 13, to obtain the multilayer wiring board 15.

Figure 17:
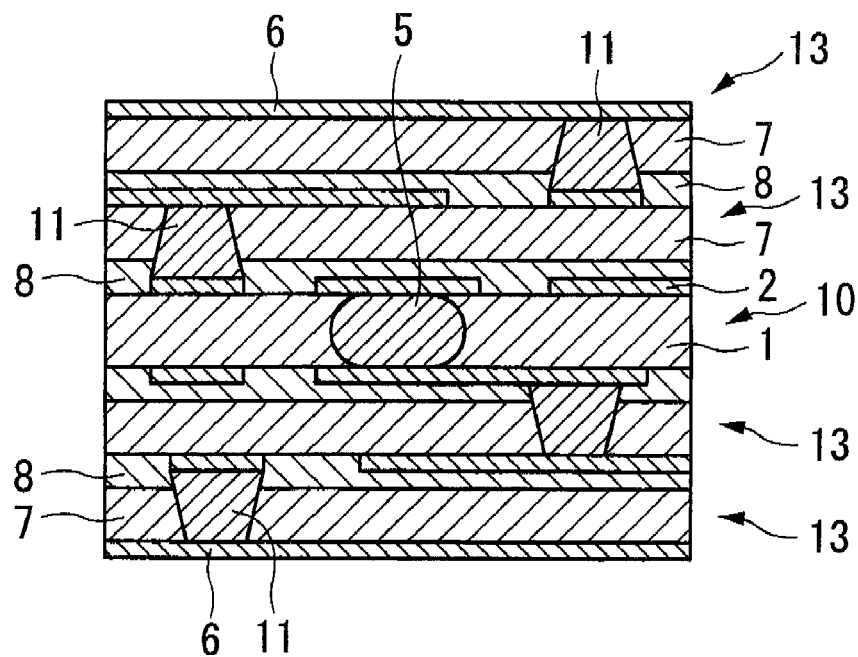
FIG. 17 is a cross-sectional view illustrating the manufacturing process subsequent to the previous drawing.
Figure 18:
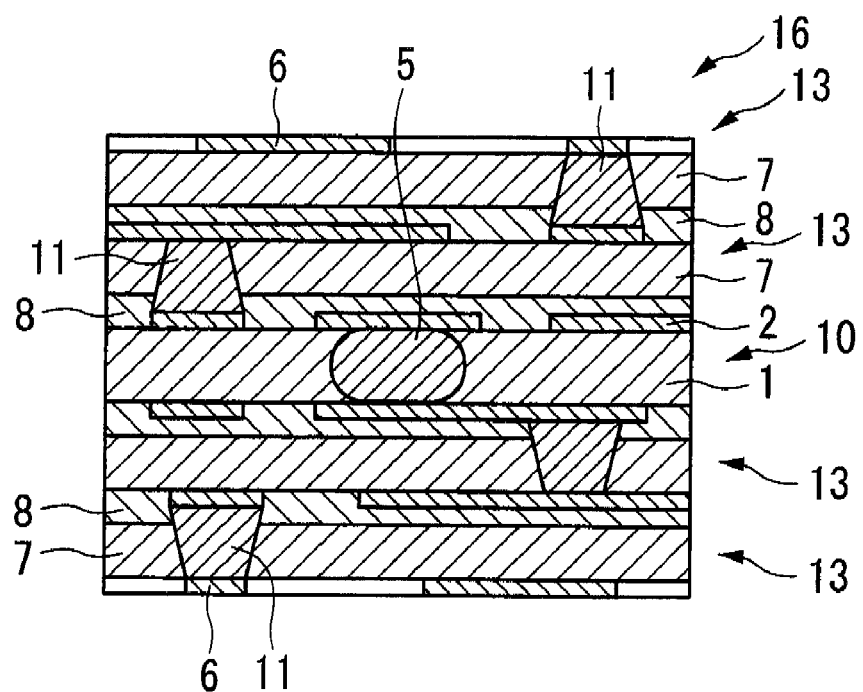
FIG. 18 is a cross-sectional view illustrating the manufacturing process subsequent to the previous drawing.

As shown in FIG. 17 and FIG. 18, additional layers may be added to the multilayer wiring board 15.

That is, the outer-layer wiring substrates 13 in the outer layer-side conductive layers 6 of which wiring patterns have not been formed are stacked onto the multilayer wiring board 15, and by performing pressing in the thickness direction, the outer-layer wiring substrates 13 are bonded to the multilayer wiring board; then, a wiring pattern is formed in the outer layer-side conductive layers 6, to obtain the multilayer wiring board 16.

According to the manufacturing method of the above second embodiment, since a wiring pattern is formed in the outer layer-side conductive layers 6 after stacking outer-layer wiring substrates 13 onto a wiring board 10, adverse effects of the pressing process on wiring may be prevented. Hence, the wiring of the outer layer-side conductive layers 6 may be made even finer.

Next, a third nonlimiting exemplary embodiment of a method for manufacturing a multilayer wiring board of the present invention is explained.

The manufacturing method of this embodiment differs from the manufacturing method of the first embodiment in that, after first stacking onto the wiring board 10 an outer-layer wiring substrate 13a in which an opening 9 and connecting portion 11 have not yet been formed, the opening 9 and connecting portion 11 are formed. The following is a detailed explanation.

Figure 19:
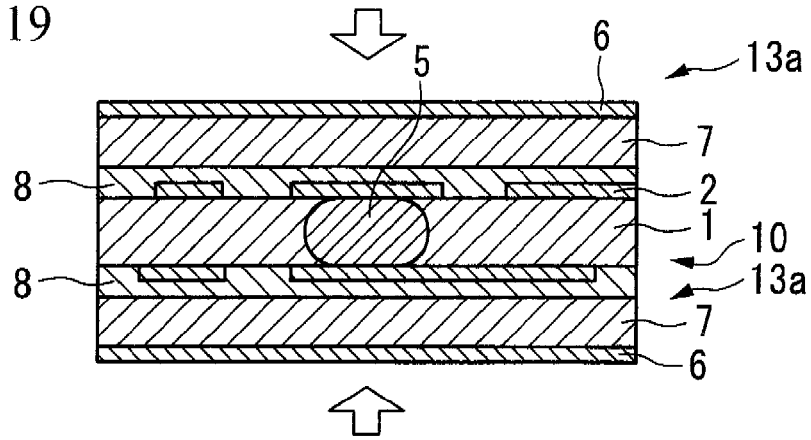
FIG. 19 is a cross-sectional view illustrating a manufacturing process of a third nonlimiting exemplary embodiment of a method for manufacturing a multilayer wiring board of the invention.

As shown in FIG. 19, outer-layer wiring substrates 13a in which an opening 9 and connecting portion 11 are formed are stacked onto both surfaces of the wiring board 10, and by performing pressing in the thickness direction, the outer-layer wiring substrates 13a are bonded to the wiring board 10 by means of the adhesive layers 8.

Figure 20:
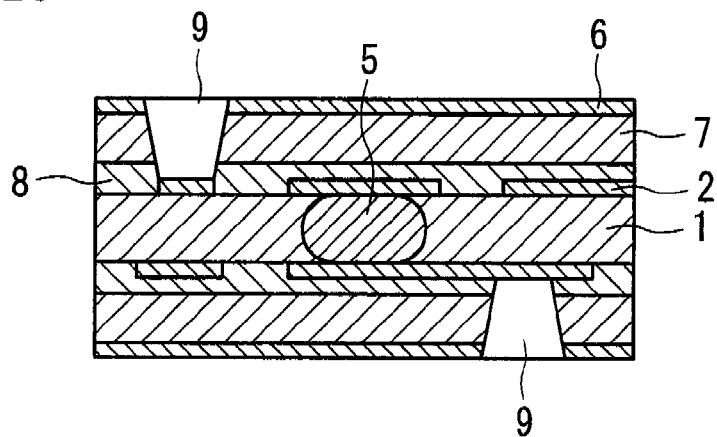
FIG. 20 is a cross-sectional view illustrating the manufacturing process subsequent to the previous drawing.
Figure 21:
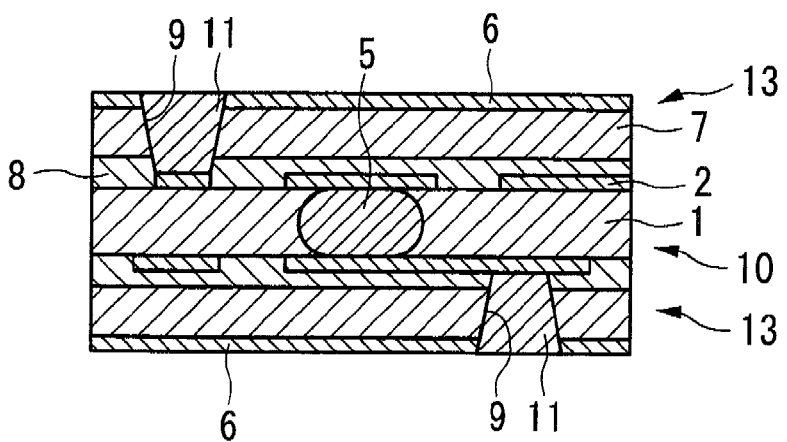
FIG. 21 is a cross-sectional view illustrating the manufacturing process subsequent to the previous drawing.

As shown in FIG. 20 and FIG. 21, openings 9 are formed in the outer layer-side conductive layers 6, insulating layers 7 and adhesive layers 8, and by filling the openings 9 with a conductive paste, the connecting portions 11 are formed.

Figure 22:
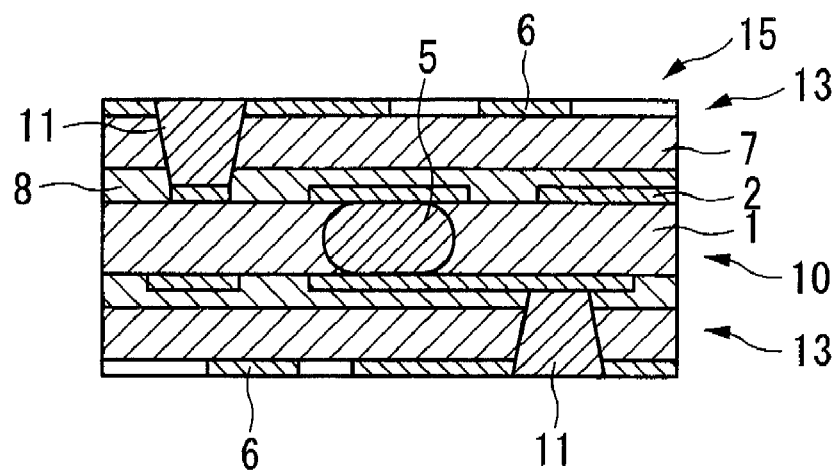
FIG. 22 is a cross-sectional view illustrating the manufacturing process subsequent to the previous drawing.

As shown in FIG. 22, by forming a pattern of wiring in the outer layer-side conductive layers 6, a multilayer wiring board 15 is obtained.

Figure 23:
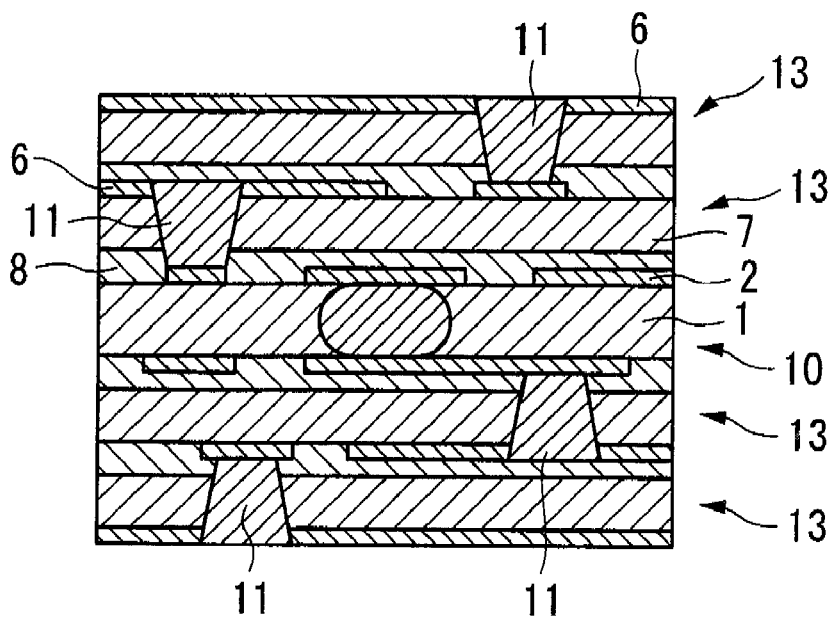
FIG. 23 is a cross-sectional view illustrating the manufacturing process subsequent to the previous drawing.

As shown in FIG. 23, by bonding outer-layer wiring substrates 13a to the multilayer wiring board 15, and then forming openings 9 and connecting portions 11 in the outer-layer wiring substrates 13a, the number of stacked outer-layer wiring substrates 13 may be increased.

According to the method of manufacturing of the above third embodiment, after stacking outer-layer wiring substrates 13a to a wiring board 10, the openings 9 and connecting portions 11 are formed, so that the connecting portions may be reliably brought into contact with the conducting layers 2 and 6, and the conductivity therebetween may be improved. Hence, the reliability of electrical connections may be improved.

According to the manufacturing methods of the first through third embodiments, as shown in FIG. 1 through FIG. 4, when manufacturing the wiring board 10, the connecting particle 4 is placed into the penetrating hole 3, and by performing pressing in the thickness direction, the particle is deformed into the connecting member 5. However, the wiring board 10 may also be manufactured by the method described below.

Figure 24:
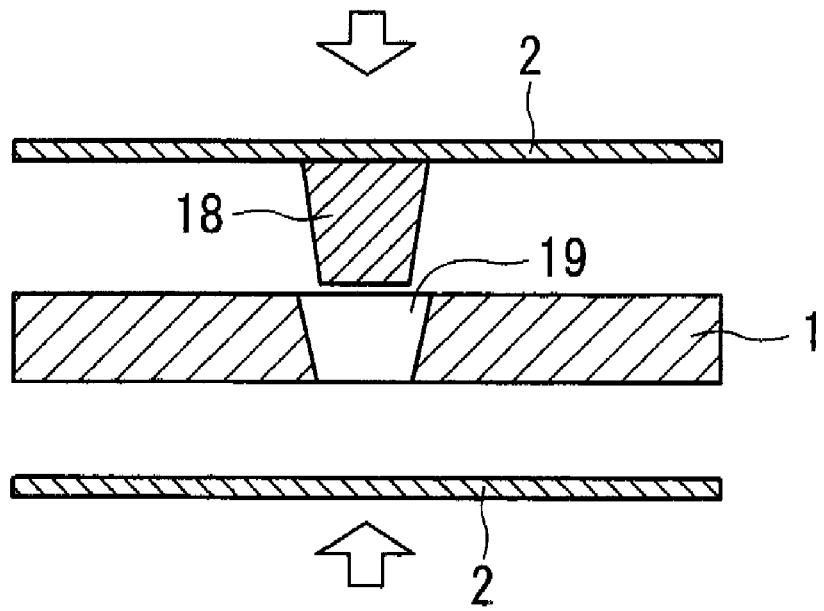
FIG. 24 is a cross-sectional view illustrating a manufacturing process of another nonlimiting exemplary embodiment of a method for manufacturing a multilayer wiring board of the invention.

As shown in FIG. 24, printing or other means are used to provide a protrusion for connection 18 on one surface (the lower surface) of an inner layer-side conductive layer 2.

The protrusion for connection 18 may be formed from copper or a copper alloy, and the thickness of the protrusion for connection 18 may be a little larger than the thickness of the insulating member 1.

The inner layer-side conductive layer 2 is stacked onto the insulating member 1 such that the protrusion for connection 18 is placed into the penetrating hole 19, and the two are pressed together in the thickness direction. The temperature, the pressure and other conditions during pressing may be the same as in the above connecting particle pressing process.

The protrusion for connection 18 is deformed in the thickness direction by pressing to become a connecting member 5, and the wiring board 10 shown in FIG. 3 is obtained.

Figure 25:
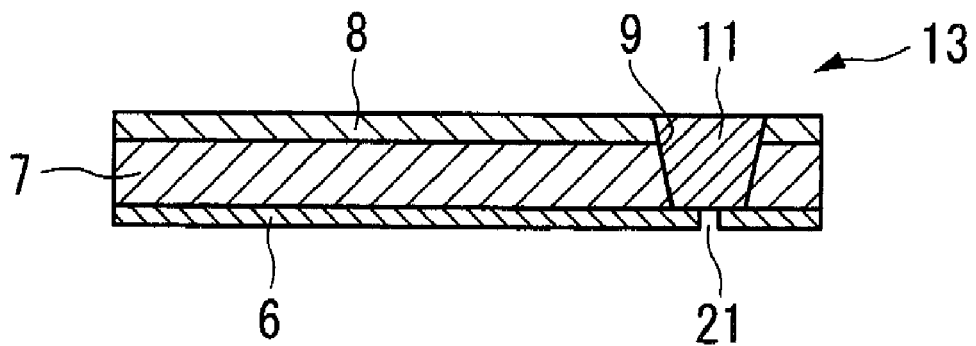
FIG. 25 is a configuration drawing showing another exemplary, but nonlimiting, embodiment of an outer-layer wiring substrate used in a multilayer wiring board of the invention.

As shown in FIG. 25, an outer-layer wiring substrate 13 may be provided with an exhaust hole 21, the inner diameter of which is smaller than the opening 9, in the outer layer-side conductive layer 6 at a position equivalent to the opening 9.

By this configuration, when the opening 9 is filled with conductive paste from the side of the adhesive layer 8 to form the connecting portion 11, air in the opening 9 may be discharged from the exhaust hole 21.

Hence, since the lingering of bubbles in the opening 9 may be prevented, and the conductive paste may be made to fill the opening 9 without voids, defects in formation of the connecting portion 11 may be prevented. Consequently, the reliability of the electrical connection may be improved.

When the wiring formed in outer layer-side conductive layers need not be fine, the following configuration may also be adopted in a multilayer wiring board of the present invention.

Figure 26:
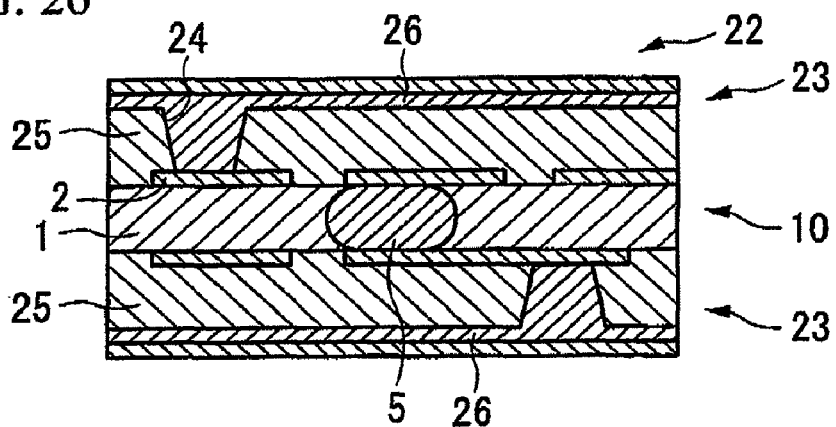
FIG. 26 is a schematic cross-sectional view illustrating another exemplary, but nonlimiting, embodiment of a multilayer wiring board of the invention.
Figure 27:
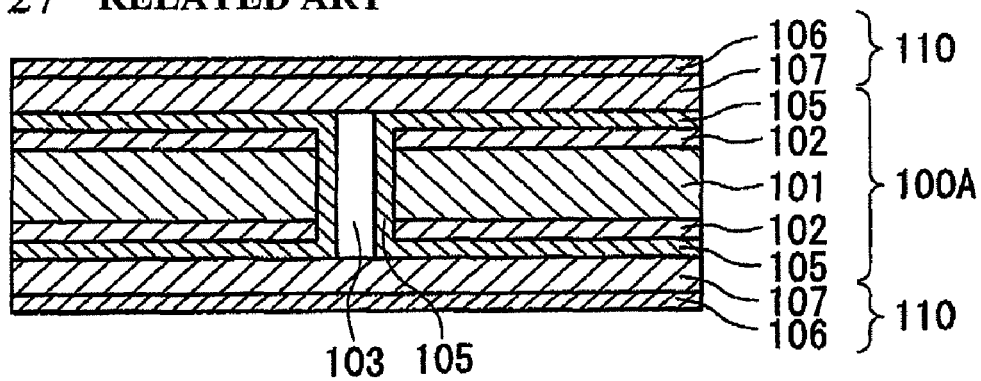
FIG. 27 is a schematic cross-sectional view illustrating an example of a conventional multilayer wiring board.
Figure 28:
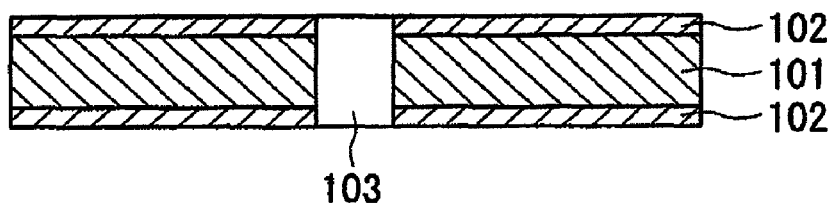
FIG. 28 is a cross-sectional view illustrating a manufacturing process of an example of a method for manufacturing the multilayer wiring board of the previous drawing.
Figure 29:
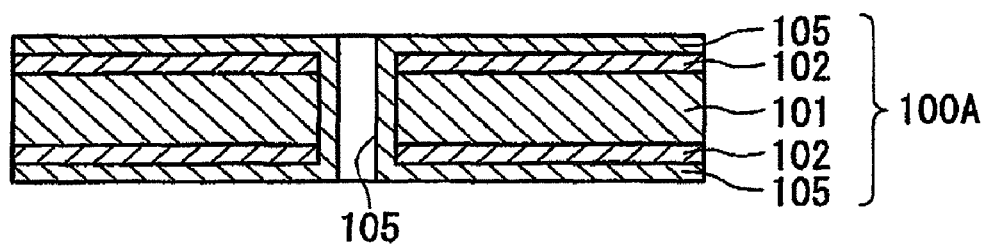
FIG. 29 is a cross-sectional view illustrating the manufacturing process subsequent to the previous drawing.

In the multilayer wiring board 22 shown in FIG. 26, outer-layer wiring substrates 23 are formed on both surfaces of a wiring board 10.

In the outer-layer wiring substrates 23, an outer layer-side conductive layer 26 is formed on one surface of the insulating layer 25 having an opening 24, and the outer layer-side conductive layer 26 is formed so as to fill the opening 24.

When using a plating method to form an outer layer-side conductive layer 26, the supply of metallic material may be continued until the opening 24 is completely filled to form the conductive layer.

In some cases an oxide layer, with a higher oxygen concentration than in other portions, may be formed at the boundary between the conductive layer and the connecting member. This oxide layer has a portion with high oxygen concentration (high-oxygen region), and a portion with low oxygen concentration (low-oxygen region).

It is believed that the low-oxygen region may, for example, be formed by the destruction of the oxide film at the surface due to deformation of the connecting particle in the process to form the connecting member. In the low-oxygen region, the conductive layer and the connecting member are bonded by metallic bonds and the like, the electrical resistance tends to be low, and the bonding strength tends to be high.

A wiring board of the present invention may be employed as a printed wiring board or other circuit board or semiconductor board on which are mounted display devices or sensor devices.

While nonlimiting exemplary embodiments of the invention have been described and illustrated above, it should be understood that these are for illustrating the invention and are not to be considered as limiting. Additions, omissions, substitutions, and other modifications may be made without departing from the spirit or scope of the present invention. Accordingly, the invention is not to be considered as being limited by the foregoing description, and is only limited by the scope of the appended claims.

What is claimed is:

1. A method for manufacturing a wiring board comprising an insulating member, comprising:
    forming a penetrating hole in the insulating member;
    inserting a conductive connecting particle into the penetrating hole;
    disposing conductive layers on both surfaces of the insulating member;
    pressing the conductive layers toward the connecting particle in the penetrating hole to deform the connecting particle in the pressing direction to obtain a connecting member such that the connecting member completely fills the penetrating hole so that there is no gap between the connecting member and the penetrating hole; and
    patterning the conductive layers, wherein the pressing is performed such that a cross-sectional area in a direction along a surface of the insulating member of at least a portion of the connecting member is greater than a contact area of the connecting member with the conductive layers, wherein the penetrating hole is formed such that an inner diameter at one end is greater than the connecting particle, and an inner diameter at the other end is smaller than the connecting particle, and wherein the penetrating hole is formed such that an inner diameter at an upper end is greater than the connecting particle, and an inner diameter at a lower end is smaller than the connecting particle.

2. The method for manufacturing a wiring board according to claim 1, wherein the dimension of the connecting particle in a thickness direction of the insulating member is larger than a thickness of the insulating member.

3. The method for manufacturing a wiring board according to claim 1, wherein after the pressing process, a contact area of the connecting member with the conductive layers is greater than a contact area of the connecting particle with the conductive layers prior to the pressing process.

4. A method for manufacturing a multilayer wiring board, the method comprising:
   manufacturing a wiring board by a method comprising:
      forming a penetrating hole in an insulating member;
      inserting a conductive connecting particle into the penetrating hole;
      disposing conductive layers on both surfaces of the insulating member;
      pressing the conductive layers toward the connecting particle in the penetrating hole to deform the connecting particle in the pressing direction to obtain a connecting member such that the connecting member completely fills the penetrating hole so that there is no gap between the connecting member and the penetrating hole; and
      patterning the conductive layers;
   placing an outer-layer wiring substrate on a surface of the manufactured wiring board; and
   pressing the outer-layer wiring substrate toward the wiring board,
   wherein a pressing pressure in the pressing of the outer-layer wiring substrate is lower than a pressing pressure in the pressing of the connecting particle,
   wherein the penetrating hole is formed such that an inner diameter at one end is greater than the connecting particle, and the inner diameter at the other end is smaller than the connecting particle.

5. The method for manufacturing a multilayer wiring board according to claim 4, further comprising placing another outer-layer wiring substrate on another surface of the manufactured wiring board, wherein pressing the outer layer wiring substrate comprises pressing both outer-layer wiring substrates toward the wiring board, wherein a dimension of the connecting particle in a thickness direction of the insulating member is larger than a thickness of the insulating member.

6. The method for manufacturing a multilayer wiring board according to claim 4, wherein the outer-layer wiring substrate comprises an insulating layer and an outer-layer side conductive layer of copper foil on one surface of the insulating layer of the outer-layer wiring substrate,
   wherein the insulating layer of the outer-layer wiring substrate has an opening, and the opening is filled with a conductive paste so as to effect a connection to the outer layer-side conductive layer.

7. The method for manufacturing a multilayer wiring board according to claim 4, wherein the pressing of the conductive layers toward the connecting particle is performed such that a cross-sectional area in a direction along a surface of the insulating member of at least a portion of the connecting member is greater than a contact area of the connecting member with the conductive layers.

8. The method for manufacturing a multilayer wiring board according to claim 4, wherein after the pressing process, a contact area of the connecting member with the conductive layers is greater than a contact area of the connecting particle with the conductive layers prior to the pressing process.

9. The method for manufacturing a multilayer wiring board according to claim 4, further comprising patterning a wire pattern on the outer layer wiring substrate prior to pressing the outer-layer wiring substrate toward the wiring board.

10. The method for manufacturing a multilayer wiring board according to claim 6, wherein a conductive connecting particle is not inserted into the opening.

11. The method for manufacturing a multilayer wiring board according to claim 9, wherein the wire pattern that is patterned on the outer layer wiring substrate prior to pressing the outer-layer wiring substrate toward the wiring board is patterned on a surface of the outer layer wiring substrate that does not contact the wiring board during the pressing of the outer-layer wiring substrate toward the wiring board.

12. The method for manufacturing a wiring board according to claim 1, wherein none of the conductive layers are attached to a surface of the insulating member when the conductive connecting particle is inserted into the penetrating hole.

13. The method for manufacturing a wiring board according to claim 1, wherein the penetrating hole is formed such that the inner diameter at the one end is greater than a diameter of the connecting particle before being inserted into penetrating hole, and the inner diameter of the other end is smaller than the diameter of the connecting particle before being inserted into the penetrating hole.

14. The method for manufacturing a multilayer wiring board according to claim 4, wherein the penetrating hole is formed such that the inner diameter at the one end is greater than a diameter of the connecting particle before being inserted into penetrating hole, and the inner diameter of the other end is smaller than the diameter of the connecting particle before being inserted into the penetrating hole.

15. The method for manufacturing a multilayer wiring board according to claim 4, wherein the penetrating hole is formed such that an inner diameter at an upper end is greater than the connecting particle, and an inner diameter at a lower end is smaller than the connecting particle.

16. The method for manufacturing a multilayer wiring board according to claim 4, wherein an adhesive layer bonds the manufactured wiring board to the outer-layer wiring substrate.

17. The method for manufacturing a multilayer wiring board according to claim 4, wherein when pressing the conductive layers, a pressing pressure is 30 kgf/cm$^2$ or higher, and when pressing the outer-layer wiring substrate, a pressing pressure is less than 30 kgf/cm$^2$.

18. The method for manufacturing a multilayer wiring board according to claim 4, wherein when pressing the conductive layers, a temperature during pressing is 200° C. or higher, and when pressing the outer-layer wiring substrate, a temperature during pressing is under 200° C.

* * * * *